United States Patent [19]

Koike et al.

[11] 4,387,987
[45] Jun. 14, 1983

[54] METHOD OF PRODUCING SOLID-STATE COLOR IMAGING DEVICES

[75] Inventors: Norio Koike, Tokyo; Akira Sasano, Hinodemachi; Yoshio Taniguchi, Hino; Toshio Nakano, Hinodemachi; Masakazu Aoki, Kodaira; Iwao Takemoto, Hindoemachi, all of Japan

[73] Assignee: Hitachi, Ltd., Tokyo, Japan

[21] Appl. No.: 266,191

[22] Filed: May 22, 1981

[30] Foreign Application Priority Data

May 26, 1980 [JP] Japan .................................. 55-68968

[51] Int. Cl.³ ........................ G03B 27/32; G03B 27/02
[52] U.S. Cl. .................................... 355/133; 29/572; 29/576 J; 354/1; 355/77; 355/132; 357/31; 427/75; 427/96
[58] Field of Search ...................... 355/32, 71, 88, 133; 354/1; 29/572, 576 J, 578; 427/75, 82, 85, 96; 357/31

[56] References Cited

U.S. PATENT DOCUMENTS

| | | | |
|---|---|---|---|
| 3,864,818 | 2/1975 | Kooi et al. | 29/578 |
| 4,081,277 | 3/1978 | Brault et al. | 29/572 |
| 4,273,596 | 6/1981 | Gutierrez | 29/572 |
| 4,287,661 | 9/1981 | Stoffel | 29/578 X |
| 4,325,169 | 4/1982 | Ponder et al. | 29/578 X |

*Primary Examiner*—Richard A. Wintercorn
*Attorney, Agent, or Firm*—Antonelli, Terry & Wands

[57] ABSTRACT

In a solid-state imaging device wherein filters of the three primary colors in the mosaic filter configuration are stacked on a solid-state imager LSI in which a plurality of picture elements each consisting of a photoelectric conversion element and a scanning element are arrayed in the shape of a matrix; a method of producing a solid-state imaging device wherein the dimensions of filter layout patterns on exposure masks for the respective colors used in case of manufacturing the color filters of:

$$T_R < T_B < T_G$$

where $T_R$ denotes the thickness of the red filter, $T_G$ that of the green filter and $T_B$ that of the blue filter, are smaller than the dimensions of the picture elements, and especially, the dimensions of the filter layout patterns on the exposure mask for manufacturing the green filters are the smallest.

11 Claims, 4 Drawing Figures

METHOD OF PRODUCING SOLID-STATE COLOR IMAGING DEVICES

BACKGROUND OF THE INVENTION

This invention relates to a method of producing a solid-state imaging device, and more particularly to a method of manufacturing color filters for use in a solid-state imaging device.

In recent years, solid-state imaging devices have been energetically developed as imaging devices of the coming generation to replace image pickup tubes or electron tubes (described in detail in "Electronics," April 1976, pp. 368–372; "Journal of the Society of Television," Vol. 33, No. 7 (1979), pp. 548–566; etc.). The colorization of the solid-state imaging devices has been made by forming color filters on a photoelectric conversion region. The color filters are classified into an organic filter obtained by dyeing an organic material such as gelatin, and an inorganic filter exploiting the optical interference. From the viewpoint of low cost, however, the organic filter of the former is used in case of the electron tube already employed in the television broadcast. Further, the organic filter is indispensable in case of the solid-state imaging device.

The inventors have found out that, as compared with an optically flat glass plate serving as the substrate of the imaging electron tube, a solid-state imager LSI (Large Scale Integration) serving as a substrate to form the color filters thereon in the production of the color solid-state imaging device involves very inconvenient problems in stacking or depositing the color filters as will be described later.

First, the features of the solid-state imaging device will be described.

(i) Since the solid-state imager LSI is produced with IC manufacturing techniques (both a MOS type imager LSI and a CCD type imager LSI ae produced with the MOS-IC technology), it has an unevenness of 1.5–2.5 $\mu$m due to an insulating film and a conductive film for interconnection formed on a silicon substrate.

(ii) A metal of high conductivity (for example, Al or Mo) is used for the interconnection, but the metal exhibits a high reflectivity.

(iii) In order to raise the resolution, the size of one picture element is reduced with enhancement in the fabrication techniques. In case of resorting to the recent 3 $\mu$m-rule technique, the size is as small as approximately 20 $\mu$m, and in case of resorting to the 1 $\mu$m-rule techniques in the future, it is anticipated to be reduced down to approximately 10 $\mu$m.

(iv) In case of the electron tube, no index signal (synchronized signal for reading out color signals) is possessed, and hence, the configuration format of the filters is the stripe filter configuration. In contrast, in case of the solid-state imaging device, clock pulses for driving the device can be utilized for index signals, and hence, the mosaic filter configuration (tiling filter configuration) which can attain a high resolution with a small number of picture elements is used (of course, the stripe filter configuration is also usable in the solid-state device, but by way of example, when red, blue and green being the three primary colors are repeated with stripes, the color resolution degrades to $\frac{1}{3}$, so that the stripe filter configuration is not used usually).

The color filters are formed successively for the respective colors in such a way that a filter material is placed on the solid-state imager LSI having been finished up to the interconnections of a photoelectric conversion element array, scanning circuitry, etc., and that the filter material is left on the photoelectric conversion elements through a photoetching process (exposure and developing) similar to the fabrication technique of the underlying LSI, whereupon the left parts are dyed in a predetermined color (in case of the three primary colors, three fabrication steps are required). Here, the foregoing four items form causes for the following problems:

The unevenness stated in (i) causes light to scatter in an area between the convex and concave parts at the exposure, so that the filter becomes narrower or conversely wider than a predetermined region decided by a photomask. The problem of the reflection stated in (ii), similarly causes the scattering of the exposure and gives rise to the narrowing or widening of the filter. Item (iii) causes the neighboring effect of light (a kind of interference) at the exposure, and the light penetrates to a region prevented from being exposed thereto by the photomask, so that the filter becomes wide. Further, since the filters have patterns in the mosaic (tiling) configuration owing to Item (iv), the etching amount is not uniform but differs depending upon positions. In addition, on account of the neighboring effect stated above, non-uniformity in the etching amount having a positional periodicity arises depending upon the configuration of the filters. That is, the narrowing and widening deviate depending upon positions, and an obtuse unevenness appears within each pattern. Among these problems, especially the widening causes the overlap between the filters of the different colors or the phenomenon of hue mixing, which is a serious problem of degrading the picture quality.

SUMMARY OF THE INVENTION

An object of this invention is to solve the problems described above, and to provide a method of producing a color solid-state imaging device attaining a good picture quality.

In order to accomplish the object, according to this invention, the dimensions of filter patterns (openings) on a photomask to be used for manufacturing color filters are reduced relative to the dimensions of picture elements integrated on a solid-state imaging IC (that is, clearances are provided between the filter pattern shape and the picture element shape), and further, the reduction dimensions (clearances) are permitted to assume equal or unequal values among the respective colors. Thus, the widening of the filters can be prevented.

The narrowing of the filters results in a kind of noise because the amount of incident light deviates and the sensitivity becomes different depending upon the respective photoelectric conversion elements. Accordingly, when the narrowing of the filters poses a problem, the dimensions of the filter patterns on the photomask may be enlarged relative to the dimensions of the picture elements conversely to the case of the widening.

DESCRIPTION OF THE PREFERRED EMBODIMENTS

Hereunder, this invention will be described in detail in conjunction with embodiments. The inventors' experiment has revealed that the widening of the filters being the foregoing problem varies depending upon the film thickness of the filter material and the configuration of the filters (geometrical configuration of the respective colors). Accordingly, the embodiments will be explained as to the individual items.

Since the spectral response of the color filter is determined by the film thickness of the filter material and the material for dyeing, a suitable dye material is first selected, and adjustments for obtaining predetermined characteristics are made by the control of the film thickness of the filter material. Accordingly, in both the cases of primary color filters (e.g., red, green and blue) and complementary color filters (e.g., cyan, magenta, green and red), the film thicknesses of the filter materials are sometimes quite different among the 3 or 4 colors, or substantially identical for the 2 colors and different for the other 1 or 2 colors.

Figure 1:
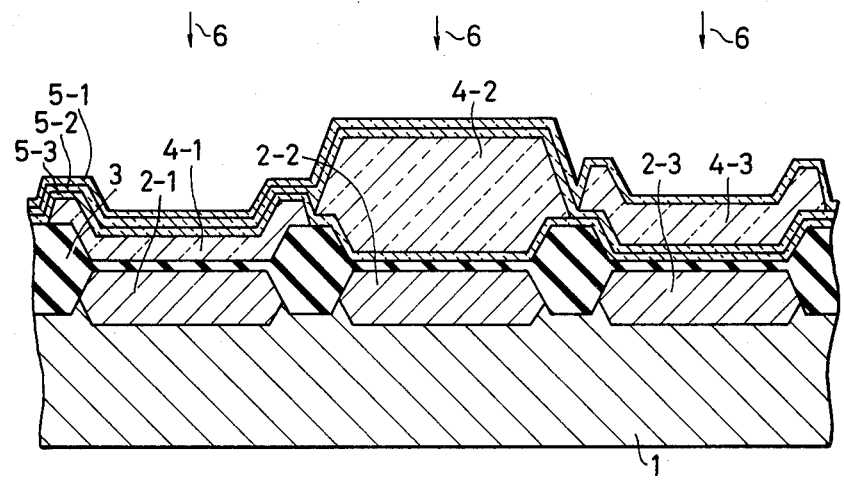
FIG. 1 is a schematic sectional view showing the structure of a solid-state imager LSI and color filters stacked thereon, in order to elucidate this invention.

In order to facilitate understanding of the description of this invention, FIG. 1 shows the structure of a solid-state imaging device in which color filters in the case of employing three colors are stacked. Numeral 1 designates a silicon substrate (of, for example, the p-type conductivity) in which photoelectric conversion elements, scanning elements, scanning circuitry for scanning the scanning elements, etc. are integrated. As the photoelectric conversion element, a photodiode is utilized in case of a MOS type imaging device, and a depletion layer under an electrode is utilized in case of a CCD type imaging device. Here, for the sake of simplicity, the photoelectric conversion elements are illustrated as photodiodes 2-1, 2-2 and 2-3 (for example, n-type diffusion layers). Numeral 3 designates an insulating film (of, for example, $SiO_2$) which serves for the isolation, passivation etc. of the photoelectric conversion elements. Here, the substrate 1, the photodiodes 2 and the insulating film 3 constitute the imager LSI described before. The scanning elements and the scanning circuitry are omitted from FIG. 1. Symbols 4-1, 4-2 and 4-3 indicate filter materials (in general, gelatins are used). The material 4-1 forms a filter for the first color having a small film thickness (for example, 0.8 $\mu$m), the material 4-2 a filter for the second color having a great film thickness (for example, 2.0 $\mu$m), and the material 4-3 a filter for the third color having a medium film thickness (for example, 1.5 $\mu$m). Intermediate layers 5-1, 5-2 and 5-3 made of a polymer resin and serving for the isolation of the respective colors and the passivation are interposed between the filters. Numeral 6 indicates incident light, which passes through the color filters, whereby radiation of the first color enters the photodiode 2-1, radiation of the second color enters the photodiode 2-2 and radiation of the third color enters the photodiode 2-3.

Figure 2:
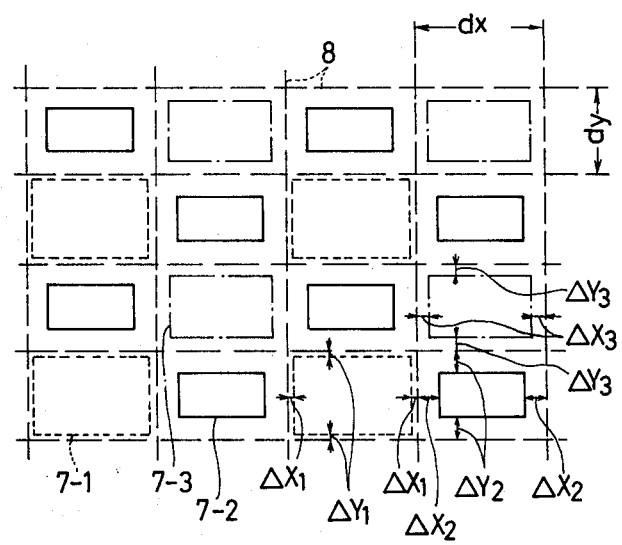
FIGS. 2, 3 and 4 are schematic plan views each showing the openings or layout patterns of photomasks for manufacturing color filters for use in a method of producing a solid-state imaging device according to this invention.
Figure 3:
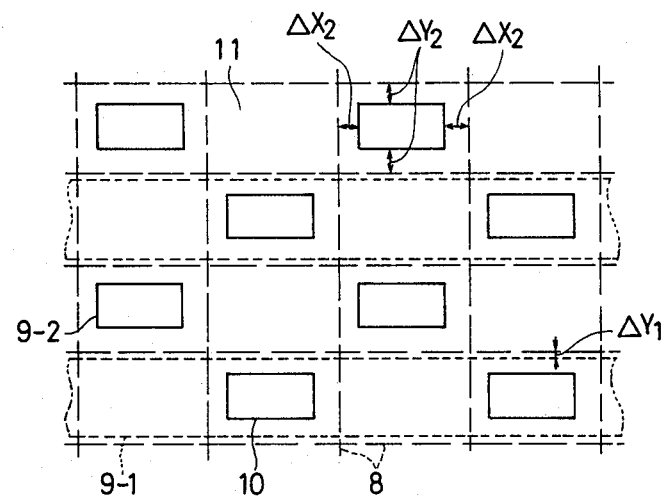

FIGS. 2 and 3 are diagrams each showing the plan layout of filter patterns (openings) on photomasks for manufacturing the color filters of this invention. FIG. 2 shows an example in the case of adopting the checkered filter configuration based on the three primary colors (red, green and blue) and being conventional in solid-state imaging device, while FIG. 3 shows an example in the case of adopting complementary color filters (cyan, yellow, green and white).

In FIG. 2, a part 7-1 (dotted line) corresponds to the first color (4-1) shown in FIG. 1, a part 7-2 (solid line) to the second color (4-2), and a part 7-3 (chain line) to the third color (4-3). Concretely, the symbols 7-1, 7-2 and 7-3 indicate the layout patterns (openings) of the photomasks for manufacturing the filters of the respective colors as are used in photoetching steps. Here, in order to clarify the relative positions among the respective color filters, the three patterns are represented in the superposed form. The pattern configuration group 7-1 corresponds to the photomask which is used in case of manufacturing the filter of the first color. The pattern configuration group 7-2 and the pattern configuration group 7-3 correspond to the photomasks for manufacturing the filters of the second color and the third color, respectively. On the other hand, numeral 8 indicates border lines corresponding to the region of one picture element which constitutes the solid-state imager LSI (the lines do not appear on the photomasks). In this example, one picture element has an area $d_x \times d_y$ (here, a rectangle in which $d_x > d_y$ holds according to the aspect ratio 4:3 of a television screen is illustrated, but a square of $d_x = d_y$ is formed in some uses such as industrial instrumentation). The inventors' experiment has revealed that as the filter is thicker, it becomes wider after the photoetching (after the patterning). Accordingly, the amount of reduction $\Delta X_1$ ($= \Delta Y_1$) from the border line 8 of the layout pattern on the mask is small in the filter of the first color having the small film thickness, the amount of reduction $\Delta X_2$ ($= \Delta Y_2$) from the border line 8 is large in the filter of the second color having the great film thickness, and the reduction amount $\Delta X_3$ ($= \Delta Y_3$) is medium in the filter of the third color having the medium film thickness. That is, the reduction amounts in the filters of the respective colors depends upon the thicknesses of these color filters, and the relationship of $\Delta X_1 = \Delta Y_1 < \Delta X_3 = \Delta Y_3 < \Delta X_2 = \Delta Y_2$ holds in the present example. The reduction amount can be determined by a magnitude with the mask registration accuracy $\Delta a_1$ of the photomask added to the widening dimension $\Delta f$ after the processing ($\Delta X = \Delta Y = \Delta f + \Delta a_1$). Accordingly, when each of the filter patterns to be arrayed on the photomask is reduced $\Delta X = \Delta Y$ with respect to the size of the picture element in advance, a filter pattern filling the picture element up to the borders 8 is obtained after the processing. In other words, according to the color filter of this invention, the pattern dimensions of the photomask to manufacture the color filter become $d_x - \Delta X$ and $d_y - \Delta Y$, and a clearance equal to $2\Delta X = 2\Delta Y$ is provided between the adjacent patterns within the mask.

FIG. 3 is a plan layout diagram of the filter patterns (openings) on the photomasks in the case of taking the complementary color configuration format of color filters as an example. 9-1 (dotted line) indicates the layout pattern of the first color, and 9-2 (solid line) that of the second color. Here, to the end of reducing the number of manufacturing steps of the color filters by one, the filter of the third color is assumed to be fabricated by the superposition of the filters of the first and second colors. Accordingly, a region 10 of the third color is formed by the stacked layers consisting of the patterns 9-1 and 9-2. As a result, the pattern 9-1 of the first color becomes a pattern which is not confined to one picture element but extends over all the picture elements of an identical row. A region 11 forms a filter of the fourth color. Since, however, white is supposed as the fourth color, actually any pattern is not existent unlike the first to third colors. Concretely, any filter is not actually formed over a photodiode corresponding to the fourth color, and only the intermediate layer for passivation as shown in FIG. 1 is formed on the photodiode. Also in the present embodiment, assuming that the film forming the filter for the first color is thin while the film of the filter for the second color is thick, the relationship of $\Delta Y_1 < \Delta X_2 = \Delta Y_2$ holds. $\Delta X_1$ is omitted in this inequality because the pattern 9-1 extends over all the picture elements of the identical row and the amount $\Delta X_1$ need not be considered.

Of course, the filter of the third color may well be formed by an independent filter, not by the superposition of the two layers of the color filters as stated before. In this case, when the film thicknesses of the respective filters are set as in the embodiment of FIG. 2, the relationship of $\Delta X_1 = \Delta Y_1 < \Delta X_2 = \Delta Y_2 < \Delta X_3 = \Delta Y_3$ is similarly existent.

Although, in the above embodiments, the reduction amounts have been made equal in both the X direction and the Y direction, actually it is sometimes the case that $\Delta X$ and $\Delta Y$ cannot be made equal because the neighboring effect of light is different between in the X direction and in the Y direction for reasons to be stated below.

On the solid-state imager LSI substrate underlying the color filters, signal output lines for reading out signal charges of the picture elements (consisting of the photoelectric conversion elements and the scanning elements) and address lines for addressing the positions of the picture elements run vertically and horizontally at pitches equal to those of the picture elements. Here, supposing that the output line is made of, e.g., Al while the address line is made of, e.g., polycrystalline silicon, the reflection factors of the respective materials are unequal, and hence, the neighboring effect becomes different between in the X direction and in the Y direction. Further, these lines have unequal widths in many cases, and also the difference in the interconnection widths renders the magnitudes of the neighboring effect unequal.

The shape of the picture element on the solid-state imaging LSI is often made the rectangle of $d_x > d_y$ as stated previously in accordance with the aspect ratio of the television screen. Also in this case, the magnitudes of the neighboring effect become unequal between in the X direction and in the Y direction.

In these two cases, $\Delta X_1 < \Delta X_3 < \Delta X_2$ and $\Delta Y_1 < \Delta Y_3 < \Delta Y_2$ hold among the reduction amounts. The relationship between $\Delta X$ and $\Delta Y$ depends upon the materials of the interconnections formed on the imager LSI substrate, the widths of the interconnections, etc., and there are the three cases of $\Delta X = \Delta Y$, $\Delta X > \Delta Y$ and $\Delta X < \Delta Y$.

In FIG. 2, the first color (the color of the color filter fabricated by the filter pattern 7-1) was made red, the second color (the color of the color filter fabricated by the filter pattern 7-2) was made green, and the third color (the color of the color filter fabricated by the filter pattern 7-3) was made blue. Further, the solid-state imager LSI was made a MOS type imager LSI. The arrayal pitch dimensions of the picture elements including the photoelectric conversion elements (photodiodes) were set at $d_x = 23$ μm and $d_y = 13.5$ μm. The vertical signal output lines running in the vertical direction on the solid-state imager LSI were formed of Al to be 4.5 μm wide, while the vertical scanning lines running in the horizontal direction on the solid-state imager LSI were formed of polycrystalline silicon to be 3.5 μm wide. In this case, filters of the three primary colors in the mosaic filter configuration as had no overlap could be formed on the solid-state imager LSI by setting the following dimensions:

$\Delta X_1 = \Delta Y_1 = 0.5$ μm (filter film thickness: 0.8 μm)

$\Delta X_2 = \Delta Y_2 = 1.5$ μm (filter film thickness: 2.0 μm)

$\Delta X_3 = \Delta Y_3 = 1.0$ μm (filter film thickness: 1.5 μm)

In FIG. 3, the solid-state imager LSI was made the same as described above, and the first color (the color of the color filter fabricated by the filter pattern 9-1) was made yellow, the second color (the color of the color filter fabricated by the filter pattern 9-2) was made cyan, the third color (the color of the region in which the filter patterns 9-1 and 9-2 were stacked) was made green, and the fourth color (the color of the region in which no filter was actually formed) was made white. Thus, complementary color mosaic (tiling) filters which did not overlap one another could be formed on the solid-state imager LSI by setting the following dimensions:

$\Delta Y_1 0.5$ μm (filter film thickness: 0.8 μm)

$\Delta X_2 = 2$ μm $\Delta Y_2 = 1$ μm (filter film thickness: 2.0 μm)

In the above MOS type solid-state imager LSI, each picture element consisted of the photodiode and the vertical scanning MOS transistor.

Figure 4:
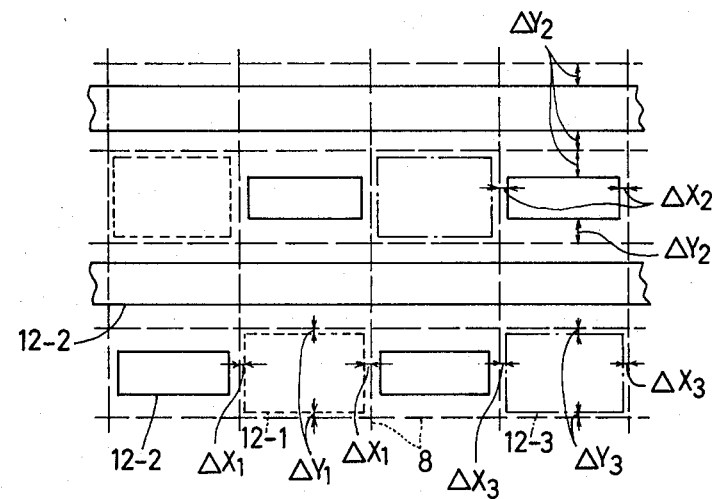

In the embodiments of FIGS. 2 and 3, there has been referred to the simple case where the neighboring effect of light generated by the filter patterns themselves is not taken into account. In some filter configuration formats, however, the number of arrayed filters of a certain color is larger than of another color. In such cases, when the dimensions of picture elements become smaller owing to the progress of integration techniques in the future and the dimensions of filter patterns become smaller accordingly, the neighboring effect of light due to the mutual interference between the patterns becomes unnegligible as stated before. FIG. 4 shows an embodiment of filter patterns in the presence of the neighboring effect of light (the filter film thicknesses are supposed equal for all the color filters). 12-1 (dotted line) indicates a filter pattern forming color filters of the first color whose arrayal number is small, 12-2 (solid line) a filter pattern forming color filters of the second color whose arrayal number is large, and 12-3 (one-dot chain line) a filter pattern forming color filters of the third color whose arrayal number is supposed to be equal to that of the first color filters. Here, the filters of the first and third colors are equal in the arrayal number and moreover the arrayal number itself is small, so that the pitches between the patterns are large. It is therefore considered that the neighboring effect is of small magnitude. On the other hand, the filters of the second color are large in the number of arrayal. Here, the pitch between the patterns in the Y direction is small, and the pattern of one row is continuous in the X direction and the pitch between the patterns in the X direction in the other row is equal to that of the case of the first and second colors. Among the reduction amounts $\Delta X$ and $\Delta Y$, accordingly, the relations of $\Delta X_1 = \Delta X_2 = \Delta X_3$ and $\Delta Y_1 = \Delta Y_3 < \Delta Y_2$ hold.

Using the photoetching masks of this invention, the inventors have become capable of fabricating color filter patterns free from widening on solid-state imager ICs. As a result, the hue mixing having heretofore appeared in devices fabricated with masks has been avoided, and it has been permitted to attain uniform sensitivities among picture elements, so that the picture quality of a color reproduced picture can be remarkably improved, this having been confirmed. Accordingly, this invention is very greatly valuable in practical use.

What is claimed is:

1. A method of producing a color solid-state imager comprising the steps of integrating in the shape of a matrix on an identical semiconductor substrate a number of picture elements, each consisting of a photoelectric conversion element and a scanning element for addressing the photoelectric conversion element, and forming, by photoetching a film of material of which color filters are made, mosaic color filters stacked on the picture elements, characterized in that the color filters are formed by the use of at least one photoetching mask having filter patterns arrayed in the shape of a matrix for manufacturing said color filters, said filter patterns having dimensions that are reduced relative to dimensions of the picture elements.

2. A method of producing a color solid-state imager as defined in claim 1, characterized in that the color filters are formed by the use of a plurality of said photoetching masks to form corresponding color filters, in which dimensions of the filter patterns on said masks differ for respective colors forming said color filters.

3. A method of producing a color solid-state imager as defined in claim 2, characterized in that the filter patterns on the mask corresponding to the color filters requiring a greater film thickness have more reduced dimensions relative to the dimensions of said picture elements than the filter patterns corresponding to the color filters requiring a lesser film thickness.

4. A method of producing a color solid-state imager as defined in claim 2, characterized in that the color filters of the colors which are larger in the arrayal number thereof have the dimensions of their corresponding filter patterns on the mask reduced more relative to the dimensions of said picture elements than the dimensions of the filter patterns corresponding to the color filters of the colors which are smaller in the arrayal number.

5. A method of producing a color solid-state imager as defined in claim 1, characterized in that three masks are provided to form three sets of color filters on the picture elements, with the filter patterns on each of said masks having different dimensions, and with the filter patterns on the mask corresponding to the color filters requiring a greater film thickness having more reduced dimensions relative to the dimensions of said picture elements than the filter pattern corresponding to the color filters requiring a lesser film thickness.

6. A method of producing a color solid-state imager as defined in claim 5, characterized in that the three masks are used to form red, green and blue color filters.

7. A method of producing a color solid-state imager as defined in claim 1, to provide a complementary color configuration format of cyan, yellow, green and white, characterized in that a first mask having filter patterns which extend over a whole row of picture elements and a second mask having filter patterns corresponding to a second color are utilized, and wherein said color filters are formed by using said first mask to provide color filters of a first color extending over a whole row of picture elements, using said second mask to form color filters of a second color, superposing said first and second masks to form color filters of a third color, and leaving some of said picture elements uncovered with a color filter.

8. A method of producing a color solid-state imager as defined in claim 7, wherein said first color is yellow, said second color is cyan, and said third color is green.

9. A method of producing a color solid-state imager as defined in claim 1, wherein said filter patterns have dimensions that are reduced to an extent that, after formation of said color filters using the masks having said filter patterns, said color filters fill out the region of the corresponding picture elements.

10. A method of forming color filters on picture elements, in the shape of a matrix, of a color solid-state imager, comprising forming, by photoetching a film of material of which said color filters are made, mosaic (tiling) color filters stacked on the picture elements, characterized in that the color filters are formed by the use of at least one photoetching mask having filter patterns arrayed in the shape of a matrix for manufacturing said color filters, said filter patterns having dimensions that are reduced relative to dimensions of the picture elements.

11. A method of forming color filters on picture elements as defined in claim 10, characterized in that the color filters are formed by the use of a plurality of said photoetching masks to form corresponding color filters in which dimensions of the filter patterns on said masks differ for respective colors forming said color filters.

* * * * *